US011028283B2

(12) United States Patent
Nadaud et al.

(10) Patent No.: US 11,028,283 B2
(45) Date of Patent: *Jun. 8, 2021

(54) SUBSTRATE HAVING A FUNCTIONAL COATING AND A TEMPORARY PROTECTION LAYER

(71) Applicant: SAINT-GOBAIN GLASS FRANCE, Courbevoie (FR)

(72) Inventors: Nicolas Nadaud, Paris (FR); Stéphanie Morlens, Paris (FR); Vincent Rachet, Montrouge (FR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 0 days.

This patent is subject to a terminal disclaimer.

(21) Appl. No.: 16/863,298

(22) Filed: Apr. 30, 2020

(65) Prior Publication Data

US 2020/0255685 A1 Aug. 13, 2020

Related U.S. Application Data

(63) Continuation of application No. 16/176,765, filed on Oct. 31, 2018, now Pat. No. 10,676,633, which is a continuation of application No. 14/909,673, filed as application No. PCT/FR2014/052040 on Feb. 2, 2016, now Pat. No. 10,144,841.

(30) Foreign Application Priority Data

Aug. 5, 2013 (FR) ..................... 1357778

(51) Int. Cl.
| | | |
|---|---|---|
| C03C 1/00 | (2006.01) |
| C09D 133/08 | (2006.01) |
| B65G 49/06 | (2006.01) |
| C03C 17/36 | (2006.01) |
| C03C 17/42 | (2006.01) |
| C09D 5/00 | (2006.01) |
| C09D 5/20 | (2006.01) |
| C03C 21/00 | (2006.01) |
| C23C 14/06 | (2006.01) |
| C23C 14/08 | (2006.01) |
| C23C 14/35 | (2006.01) |
| C23C 14/58 | (2006.01) |

(52) U.S. Cl.
CPC ......... *C09D 133/08* (2013.01); *B65G 49/069* (2013.01); *C03C 17/36* (2013.01); *C03C 17/366* (2013.01); *C03C 17/3626* (2013.01); *C03C 17/3644* (2013.01); *C03C 17/42* (2013.01); *C03C 21/00* (2013.01); *C09D 5/006* (2013.01); *C09D 5/008* (2013.01); *C09D 5/20* (2013.01); *C23C 14/0641* (2013.01); *C23C 14/083* (2013.01); *C23C 14/35* (2013.01); *C23C 14/58* (2013.01); *C23C 14/5873* (2013.01); *C03C 2218/328* (2013.01); *C03C 2218/355* (2013.01)

(58) Field of Classification Search
None
See application file for complete search history.

(56) References Cited

U.S. PATENT DOCUMENTS

| | | |
|---|---|---|
| 4,413,877 A | 11/1983 | Suzuki |
| 4,751,121 A | 6/1988 | Kuhnel |
| 5,725,909 A | 3/1998 | Shaw |
| 5,866,199 A | 2/1999 | Swidler et al. |
| 5,877,895 A | 3/1999 | Shaw |
| 6,233,973 B1 | 5/2001 | Foster |
| 6,245,382 B1 | 6/2001 | Shvartsman |
| 6,447,891 B1 | 9/2002 | Veerasamy |
| 2002/0176988 A1 | 11/2002 | Medwick et al. |
| 2005/0181219 A1 | 8/2005 | Depauw et al. |
| 2006/0065350 A1 | 3/2006 | Richardson |
| 2007/0231553 A1 | 10/2007 | Hartig et al. |
| 2007/0243391 A1 | 10/2007 | Varaprasad |
| 2009/0044897 A1 | 2/2009 | Thomsen et al. |
| 2009/0068350 A1 | 3/2009 | Varaprasad |
| 2009/0136765 A1 | 5/2009 | Maschwitz |
| 2009/0258187 A1 | 10/2009 | Brady et al. |
| 2011/0179997 A1 | 7/2011 | Hayata |
| 2012/0009388 A1 | 1/2012 | Varaprasad et al. |
| 2012/0094112 A1 | 4/2012 | Lmran |

FOREIGN PATENT DOCUMENTS

| | | |
|---|---|---|
| FR | 2 879 188 A1 | 6/2006 |
| WO | WO 00/50354 | 8/2000 |
| WO | WO 01/02496 A2 | 1/2001 |
| WO | WO 2004/085135 A2 | 10/2004 |

OTHER PUBLICATIONS

International Search Report as issued in International Patent Application No. PCT/FR2014/052040, dated Nov. 6, 2014.
Schaefer et al. "Low emissivity coatings on architectural glass" Surface and Coatings Technology 1997, 93, 37-45. (Year: 1997).

*Primary Examiner* — Robert S Loewe
(74) *Attorney, Agent, or Firm* — Pillsbury Winthrop Shaw Pittman LLP

(57) ABSTRACT

An article includes a substrate including two main faces defining two main surfaces separated by edges, the substrate bearing a functional coating deposited by magnetron sputtering deposited on at least one portion of one main surface, and a temporary protective layer deposited on at least one portion of the functional coating, wherein, the temporary protective layer is deposited directly in contact with the functional coating, the temporary protective layer has a thickness of at least 1 micrometer, the temporary protective layer is not soluble in water, and the temporary protective layer is obtained from a composition comprising (meth) acrylate compounds, the substrate bearing the functional coating has not undergone a heat treatment at a temperature above 400° C.

20 Claims, No Drawings

SUBSTRATE HAVING A FUNCTIONAL COATING AND A TEMPORARY PROTECTION LAYER

CROSS-REFERENCE TO RELATED APPLICATIONS

This application is a continuation of U.S. patent application Ser. No. 16/176,765, filed on Oct. 31, 2018, which is a continuation of U.S. patent application Ser. No. 14/909,673, filed on Feb. 2, 2016, which is the U.S. National Stage of PCT/FR2014/052040, filed Aug. 5, 2014, which in turn claims priority to French patent application number 1357778 filed Aug. 5, 2013. The content of these applications are incorporated herein by reference in their entireties.

The invention relates to the protection of substrates, preferably glass substrates, bearing at least one functional coating. These substrates are intended to be subjected to transport, processing and/or storage steps.

It is known to use articles comprising substrates bearing functional coatings in order to give said substrates optical properties (mirror or antireflection layers), thermal properties (low-emissivity, solar-control or solar-protection layers, especially based on silver layers) or electrical properties (antistatic layers, transparent conductive layers).

Many functional coatings deposited on substrates have a low mechanical strength, especially high scratchability and a low abrasion resistance. Finally, certain functional coatings are subject to corrosion during storage, especially in a wet environment.

In particular, the substrates bearing functional coatings based on metallic layers, for example based on silver or on a silver-based alloy, exhibit these drawbacks. These substrates are generally used as laminated glazing or multiple, double or triple, glazing for solar-control and/or low emissivity applications. The functional coatings are then deliberately encapsulated in the glazing.

Glass substrates bearing functional coatings of this type are for example sold by the company Saint-Gobain under the name Cool Lite®. These substrates have very good optical performances (LT, color) and thermal performances (solar factor). These performances are obtained owing to functional coatings comprising complex multilayers with in particular more than about ten thin layers of different thicknesses and different natures.

These substrates are subjected to various processing steps such as steps of cutting, washing, shaping the edges, assembling and/or heat treatments of tempering, annealing and/or bending type. It is common and practical to carry out the assembling and/or the various treatments at a site other than the one where the substrate bearing the functional coating is manufactured. These substrates are therefore also subjected to storage and transport steps.

The mechanical stresses capable of generating scratch-type impairments are numerous and comprise in particular:
the step of storing the substrates after deposition of the functional coating at the production site,
the step of moving the substrates, stacked or not, from the production site to the processing site,
the step of shaping and storing at the processing site,
the step of washing in a wet environment carried out for example before a heat treatment or assembly as double glazing unit (DGU) or as triple glazing unit (TGU),
the steps of passing over rolls, for example on the rolls of the furnace with a view to a heat treatment, especially in the case of bi-functionalized substrates bearing functional coatings on each face.

The visibility of the scratches, once created, increases considerably when the substrate is subjected to a heat treatment of tempering type. The scratchability of such substrates is prejudicial from the esthetic viewpoint and from the production efficiency viewpoint. Indeed, scratches not visible before heat treatment, which are only revealed afterwards, may lead to an abnormally high scrap rate. The financial loss is then even higher since the substrate scrapped includes the cost of the heat treatment.

Complex functional coatings and especially those comprising thin metallic layers based on silver also have a low abrasion resistance. These mechanical stresses may induce defects other than scratches such as partial or complete detachment of one or more layers of the functional coating.

Corrosion phenomena may also occur depending on the nature of the materials constituting the functional coatings. But above all, their occurrence is greatly dependent on the moisture, temperature and duration conditions of the various moving, storage, washing and/or heat treatment steps. The functional coatings comprising in particular metallic layers or layers based on hygroscopic oxides are moisture-sensitive.

All defects or scratches of the functional coating, whether they are due to corrosion or to mechanical stresses, are capable of impairing not only the esthetics but also the optical and/or energy performances of the substrate. Handling of substrates bearing such coatings requires many precautions during the transport, processing and/or storage steps.

It is known to protect the surface of the substrate with peelable adhesive polymer films. These films may be deposited in the solid state (such as for example in application EP-A-1 610 940), or in the liquid state (U.S. Pat. No. 5,866,199). These solutions using peelable films have the following drawbacks:
a high cost,
a peeling step that is long, tedious and capable of leaving traces of the agent providing the bond between the substrate and the film,
a possible delamination of the functional coating during the peeling phase, and
the need to deal with the scraps of peeled films.

The deposition of a same peelable film in the solid state on substrates of large size is sometimes difficult and may require the use of several films. Problems are faced on joining the films:
either a portion of the functional coating is not covered by one or other of the films and in this case the protection is incomplete,
or the films overlap, which potentially leads to risks during the cutting of the substrate.

Polymer films obtained from a liquid phase and that can be removed by cleaning using aqueous solutions have also been developed. Application WO 00/50354 discloses for example films obtained from aqueous solutions of acrylic polymers that can easily be removed with water, since the polymer is itself water soluble.

Application WO 01/02496 discloses a coating intended to temporarily protect a substrate during a transport, handling or storage step, by application of a removable protective coating. The coating may be a film obtained from aqueous solutions of polymers. The polymers constituting the film may be selected from homopolymers or copolymers of starch or casein, polymers derived from proteins, acrylic polymers, polyacrylamides, polyalkylene oxide polymers, polyvinyl acetate, polyvinyl alcohols, polyvinylpyrrolidone, styrene/acrylic acid copolymers, ethylene/acrylic acid copolymers, cellulose copolymers and derivatives of cellulose.

The protective coating is preferably removed by aqueous washing. According to one embodiment that is not preferred, this coating may also be removed by thermal decomposition or combustion.

The temporary protective layers that can be removed during washing are not capable of protecting the substrate against wet corrosion during storage. But above all, these layers do not protect the functional coating during washing phases. Furthermore, they additionally have the drawback of giving rise to a pollution of the washing machine of the processing company.

The solutions from the prior art are not sufficiently effective to limit the contact between the functional coating and the chemical elements including liquid water or water vapor, that may lead to cold corrosion during the various storage and/or processing steps.

There is therefore a need to temporarily protect the substrates bearing a functional coating during the production, processing, transport and/or storage steps. The temporary protection must be sufficiently durable to enable protection of the surface of the substrate both against physical impairments, and against corrosion in a wet environment or during a washing step.

For this purpose, one subject of the invention is an article comprising a substrate comprising two main faces defining two main surfaces separated by edges, said substrate bearing:
  a functional coating deposited on at least one portion of one main surface and
  a temporary protective layer deposited on at least one portion of the functional coating,
characterized in that:
  the temporary protective layer has a thickness of at least 1 micrometer,
  the temporary protective layer is not soluble in water,
  the temporary protective layer is obtained from a composition comprising (meth)acrylate compounds.

The temporary protective layer is cured by drying, by IR curing, by UV irradiation or by an electron beam.

The temporary protective layer is obtained from a liquid composition comprising (meth)acrylate compounds selected from monomers, oligomers, prepolymers or polymers comprising at least one (meth)acrylate function.

The temporary protective layer according to the invention is specifically intended to be removed during a heat treatment of tempering, annealing and/or bending type at a sufficient temperature to enable its removal by thermal decomposition. Surprisingly, this temporary protective layer is removed without damaging the optical properties of the substrate bearing the functional coating. One and the same heat treatment step of the protected substrate makes it possible to remove the protection from the substrate and to give the substrate certain properties or conformation (tempered and/or curved substrate).

Preferably, the protected substrate, that is to say the substrate bearing the temporary protective layer has not undergone a heat treatment of tempering, annealing and/or bending type, that is to say heat treatment at a temperature above 200° C. or above 400° C. The protected substrate is not tempered and/or curved.

Preferably, the substrate bearing the functional coating has not undergone a heat treatment at high temperature of tempering, annealing and/or bending type, that is to say heat treatment at a temperature above 200° C. or above 400° C. This means that the article formed by the substrate and the functional coating has not undergone heat treatment at high temperature. This also means that the process does not comprise a heat treatment step at high temperature, that is to say heat treatment at a temperature above 200° C. or above 400° C., between the deposition of the functional coating and the deposition of the temporary protective layer.

This temporary protective layer essentially comprises organic materials of (meth)acrylate polymer type. Its chemical formulation enables rapid and complete combustion during a heat treatment and only generates, during its decomposition, volatile molecules that are easy to eliminate.

This water-insoluble layer makes it possible to obtain effective protection during the washing step and against wet corrosion.

Surprisingly, the protection is maintained even when the substrate undergoes successive cutting operations. Indeed, the substrates protected according to the invention appear to be protected from corrosion mechanisms that could be initiated on the one hand on the full face but also from the cutting edge. The substrates protected according to the invention may therefore be cut several times without it being necessary to modify the protective layer and without losing the mechanical and chemical protection functions.

Another subject of the invention is the process for protecting said article and the production line for a substrate protected according to the invention. In the remainder of the text, the preferred embodiments apply in the same manner to the various subjects of the invention, the substrate, the process and the production line.

Application WO 01/02496 does not mention polymers comparable to the (meth)acrylate compounds used according to the invention. This application discloses preferentially organic protective layers that are soluble in water, especially based on polyvinyl alcohol, and that are easily hydrolyzable. Such layers do not respond to the problem of the invention which is in particular to withstand corrosion in a wet environment and/or washing before processing.

But above all, although this document envisages the removal of an organic temporary protective layer by thermal decomposition during a tempering type treatment, it discourages proceeding in this way. Indeed, it is expressly mentioned that the removal by combustion is not preferentially used when the substrates comprise a functional coating deposited by magnetron sputtering.

Surprisingly, the temporary protective layer according to the invention may be completely removed during a heat treatment by decomposition without damaging the optical, energy or thermal properties conferred on the substrate by the functional coating. These advantageous properties are obtained even when the functional coating has been deposited by magnetron sputtering.

The temporary protective layer according to the invention is intended to be applied preferably on leaving the production line for substrates bearing functional coatings. The deposition step may be easily incorporated into the process for manufacturing the substrate bearing the functional coating.

The application of a temporary protective layer obtained from a liquid composition that is essentially free of solvent and is preferably cured by UV irradiation, by IR curing or by an electron beam is particularly advantageous. The choice of this solvent-free technology considerably simplifies the industrial implementation of a process comprising a step of applying such a layer. The absence of solvent makes it possible to avoid installing a device for drying, recovering and treating the solvent vapors that must not be emitted into the atmosphere. The modifications to be made may be limited to inserting, at the end of the line, a deposition device, for example a roll coater deposition device and also a crosslinking device such as a UV lamp.

The liquid composition has, owing to the judicious choice of the (meth)acrylate compounds, a viscosity suitable for making it possible to easily obtain a temporary protective layer having a thickness greater than or equal to 1 µm and sufficient reactivity to enable almost instantaneous crosslinking throughout the thickness. The chemical nature, the degree of crosslinking, the density and also the thickness of the temporary protective layer contribute to obtaining effective protection against abrasion, the appearance of scratches and corrosion. These protective properties are obtained for thicknesses of less than 50 micrometers.

Finally, the absence of solvent coupled with the almost instantaneous curing, for example by UV irradiation or by an electron beam, makes it possible to obtain protected substrates with no effect on the production rates. Advantageously, the coating rates are compatible with the rates of deposition of the functional coatings which enables continuous manufacture of substrates bearing a functional coating and a temporary protective layer according to the invention. For example, the rates of application of the temporary protective layer, comprising for example the coating and the crosslinking, may be between 1 and 90 m/min on a substrate having a width of 1 m to 3.3 m.

Although the invention is very particularly suitable for the protection of substrates bearing mechanically weak functional coatings, the solution of the invention may be applied to the protection of substrates bearing all types of functional coating.

The functional coating comprises at least one functional layer. The functional layer is preferably a layer that can act on solar radiation and/or infrared radiation of large wavelength. These functional layers are, for example, metallic functional layers based on silver or a metal alloy containing silver.

The substrate may comprise a functional coating comprising a thin-film multilayer successively comprising, starting from the substrate, an alternation of n functional metallic layers, especially functional layers based on silver or on a metal alloy containing silver, and of (n+1) antireflection coatings, each antireflection coating comprising at least one dielectric layer, so that each functional metallic layer is positioned between two antireflection coatings.

The substrate may comprise a thin-film multilayer successively comprising, starting from the substrate, an alternation of two functional metallic layers, especially functional layers based on silver or on a metal alloy containing silver, and of three antireflection coatings, each antireflection coating comprising at least one dielectric layer, so that each functional metallic layer is positioned between two antireflection coatings.

The substrate may also comprise a thin-film multi-layer successively comprising, starting from the substrate, an alternation of three functional metallic layers, especially functional layers based on silver or on a metal alloy containing silver, and of four antireflection coatings, each antireflection coating comprising at least one dielectric layer, so that each functional metallic layer is positioned between two antireflection coatings.

The thickness of the functional coating is:
greater than 100 nm, preferably greater than 150 nm,
less than 300 nm, preferably less than 250 nm.

According to one particularly advantageous embodiment of the invention, the functional coating comprises an upper layer selected from nitrides, oxides or oxynitrides of titanium, of zirconium and/or of hafnium. The upper layer of the functional coating is the layer furthest from the substrate and/or the layer in direct contact with the temporary protective layer.

Surprisingly, the Applicant has discovered that there is a synergy between an upper layer based on titanium, zirconium and/or hafnium and the temporary protective layer. This synergy translates in particular into the complete absence of surface defects and also into very small colorimetric variations between the product before and after tempering. Finally, the synergy also translates into a very low haze after tempering.

The upper layer may in particular be a layer:
of titanium nitride; of zirconium nitride; of hafnium nitride; of titanium zirconium nitride; of titanium zirconium hafnium nitride;
of titanium oxide; of zirconium oxide; of hafnium oxide; of titanium zirconium oxide; of titanium zirconium hafnium oxide.

The thickness of these upper layers is preferably between 1 and 20 nm and better still between 1 and 5 nm.

According to one variant, the upper layer may be a silicon nitride layer, optionally doped with aluminum. The thickness of this upper layer is preferably between 5 and 50 nm and better still between 10 and 50 nm.

The functional coating may be deposited by any known means such as by magnetron sputtering, by thermal evaporation, by CVD or PECVD, by pyrolysis, by chemical deposition, by sol-gel deposition or wet deposition of inorganic layers.

The functional coating is preferably deposited by magnetron sputtering. According to this advantageous embodiment, all the layers of the functional coating are deposited by magnetron sputtering. The temporary protective layer is advantageously directly in contact with the functional coating.

The temporary protective layer is essentially of organic nature. The (meth)acrylate compounds that have reacted together represent at least 90% by weight of the weight of the temporary protective layer.

The term "(meth)acrylate" is understood to mean an acrylate or a methacrylate. The expression "(meth)acrylate compounds" is understood to mean the esters of acrylic or methacrylic acid comprising at least one acryloyl ($CH_2$=CH—CO—) or methacryloyl ($CH_2$=CH($CH_3$)—CO—) function. These esters may be monomers, oligomers, prepolymers or polymers. These (meth)acrylate compounds, when they are subjected to the polymerization conditions, give a polymer network endowed with a solid structure.

The (meth)acrylate compounds used according to the invention may be selected from monofunctional and polyfunctional (meth)acrylates such as mono-, di-, tri- and poly-functional (meth)acrylates. Examples of such monomers are:

monofunctional (meth)acrylates such as methyl (meth)acrylate, ethyl (meth)acrylate, n- or tert-butyl (meth)acrylate, hexyl (meth)acrylate, cyclohexyl (meth)acrylate, 2-ethylhexyl (meth)acrylate, benzyl (meth)acrylate, 2-ethoxyethyl (meth)acrylate, phenoxyethyl (meth)acrylate, hydroxyethyl acrylate, hydroxypropyl (meth)acrylate, vinyl (meth)acrylate, caprolactone acrylate, isobornyl methacrylate, lauryl methacrylate, polypropylene glycol monomethacrylate, difunctional (meth)acrylates such as 1,4-butanediol di(meth)acrylate, ethylene dimethacrylate, 1,6-hexanediol di(meth)acrylate, bisphenol A di(meth)acrylate, trimethylolpropane diacrylate, triethylene glycol diacrylate, ethylene glycol di(meth)acrylate, polyethylene glycol di(meth)acrylate, tricyclodecane dimethanoldiacrylate, trifunctional (meth)acrylates such as trimethylolpropane trimethacrylate, trimethylolpropane triacrylate, pentaerythritol triacrylate, ethoxylated trimethylolpropane triacrylate, trimethylolpropane trimethacrylate, tripropylene glycol triacrylate, (meth)acrylates of higher functionality such as pentaerythritol tetra(meth)acrylate, ditrimethylpropane tetra(meth)acrylate, dipentaerythritol penta(meth)acrylate or hexa(meth)acrylate.

According to one advantageous embodiment, the temporary protective layer does not comprise mineral filling materials such as fillers or pigments. Neither does the temporary protective layer comprise additives that are not capable of being eliminated during the heat treatment such as silicon-comprising organic compounds of siloxane type.

The temporary protective layer has a thickness:
greater than 1 micrometer, preferably greater than 5 micrometers,
less than 100 micrometers, preferably less than 50 micrometers,
between 2 and 100 micrometers, between 5 and 50 micrometers or between 10 and 30 micrometers.

The temporary protective layer has a grammage between 5 and 50 g/m$^2$, preferably between 10 and 30 g/m$^2$.

According to advantageous embodiments of the invention, the liquid composition has the following characteristics:
the liquid composition comprises less than 20% by weight of solvent with respect to the total weight of the liquid composition,
the liquid composition comprises less than 10% by weight of solvent with respect to the total weight of the liquid composition,
the liquid composition is solvent free,
the liquid composition has a viscosity measured at 25° C.:
of at least 0.05 Pa·s, of at least 0.08 Pa·s, of at least 0.1 Pa·s, of at least 0.50 Pa·s,
of at most 5 Pa·s, of at most 2 Pa·s,
between 0.05 and 5 Pa·s;
the liquid composition comprises at least one polymerization initiator, preferably a photoinitiator,
the polymerization initiator represents 0.1% to 20%, or 1% to 15%, preferably 5% to 15% and better still 8% to 12% by weight of the total weight of the (meth)acrylate compounds,
the liquid composition additionally comprises at least one additive selected from plasticizers, absorbers, separating agents, heat and/or light stabilizers, thickeners or surface modifiers,
the sum of all the additives is between 0 and 5% by weight of the weight of the liquid composition,
the (meth)acrylate compounds selected from esters of acrylic or methacrylic acid comprising at least two acryloyl (CH$_2$=CH—CO—) or methacryloyl (CH$_2$=CH(CH$_3$)—CO—) functions,
the liquid composition comprises, by weight with respect to the total weight of the (meth)acrylate compounds, in order of increasing preference, at least 50%, at least 60%, at least 70%, at least 80%, at least 90% or 100% of (meth)acrylate compounds selected from esters of acrylic or methacrylic acid comprising at least two acryloyl (CH$_2$=CH—CO—) or methacryloyl (CH$_2$=CH(CH$_3$)—CO—) functions, the liquid composition comprises:
at least one aliphatic urethane-acrylic oligomer,
at least one (meth)acrylate monomer selected from mono-, bi- or tri-functional (meth)acrylate monomers,
at least one polymerization initiator,
the liquid composition comprises:
at least one aliphatic urethane-acrylic oligomer,
at least one difunctional (meth)acrylate monomer,
at least one trifunctional (meth)acrylate monomer,
at least one polymerization initiator, preferably a photoinitiator,
the liquid composition comprises, by weight with respect to the total weight of the (meth)acrylate compounds:
30% to 80% by weight of at least one aliphatic urethane-acrylic oligomer,
20% to 70% by weight of at least one (meth)acrylate monomer selected from a mono-, bi- or tri-functional (meth)acrylate.

According to the invention, the polymerization initiators are not considered to be additives.

The liquid composition may be applied at ambient temperature by any known means and especially by roll coating, flow coating, dip coating, curtain coating or spray coating. The liquid composition is preferably applied by roll coating. The rate of deposition of the liquid composition may be between 1 and 90 m/min.

The temporary protective layer may be cured:
by drying at a temperature below 200° C. for a duration ranging for example from 10 s to 180 s,
by UV (various wavelengths) crosslinking preferably in open air and at ambient temperature or
by an electron beam.

The liquid composition additionally comprises a polymerization initiator, the nature of which depends on the type of curing selected. For example, in the case of thermal curing, initiators of benzyol peroxide type are used. In the case of curing by UV radiation, initiators referred to as photoinitiators are used.

The substrate to be protected must withstand a heat treatment above 200° C., preferably above 400° C. The invention therefore relates to any substrate consisting of materials that withstand these temperatures without major alteration. As substrate, mention may be made of glass substrates, glass-ceramic substrates, ceramic substrates, steel substrates and metal substrates having a melting point above 250° C. The substrate is preferably a glass substrate.

Advantageously, the substrate bearing the temporary protective layer has not undergone a heat treatment of tempering, annealing and/or bending type, that is to say heat treatment at a temperature above 200° C.

The glass substrate may be flat, colorless and/or colored. The thickness of the substrate is preferably between 1 and 19 mm, more particularly between 2 and 10 mm, or even between 3 and 6 mm.

According to one variant of the invention, the temporary protective layer may be used to protect the functional coating during a step of depositing another coating. This other coating may be deposited on a portion of the main surface of the substrate that bears the functional coating or on a portion of the main surface of the substrate that does not bear the functional coating.

It is in particular known that to obtain bi-functionalized substrates bearing a functional coating on each main face, the contact of the functional coating deposited first with the rolls of the deposition device during the second passage enabling the deposition of the second coating leads to alterations that are damaging to the quality of the first coating (pollution, scratches). These alterations becoming visible after deposition of the second functional coating and optionally tempering. The invention makes it possible to overcome this problem by protecting the first coating with a protective layer intended to disappear during the tempering or bending of the bifunctionalized substrate.

According to another variant of the invention, the temporary protective layer may be used to protect the rear surface of the substrate during the deposition of a functional coating. Indeed, the passage on the rolls of the rear face of a substrate, for example made of glass, during the deposition of a functional coating, is capable of partially altering said surface (soiling, scratching). The invention makes it possible to overcome this problem by protecting the rear surface of the substrate before deposition of the first coating.

The temporary protective layer may be deposited:
on each of the main surfaces of the substrate and/or
on at least one edge of the substrate and/or
on each of the edges of the substrate.

When the temporary protective layer is deposited on each of the main surfaces of the substrate and on each of the edges of the substrate, the chemical and/or mechanical protection is then conferred on the entire surface area of the substrate.

The temporary protective layer may be deposited on a glass substrate before or after a cutting step, that is to say on a glass substrate that is at the final size or close to the final size (crude).

Another subject of the invention is a process for protecting an article comprising a substrate comprising two main faces defining two main surfaces separated by edges, said glass substrate bearing a functional coating deposited on at least one portion of one main surface, said protection process comprising the following steps:
preparing a liquid composition comprising (meth)acrylate compounds selected from monomers, oligomers, prepolymers or polymers comprising at least one (meth) acrylate function,
applying the composition to at least one portion of the functional coating, preferably with the aid of a roll, over a thickness of at least 1 micrometer,
crosslinking the composition so as to form the temporary protective layer.

The protection process comprises the step of removing said temporary protective layer via a high-temperature heat treatment. The heat treatment temperature is above 200° C., above 300° C., or above 400° C. The heat treatments are selected from annealing, for example by flash annealing such as laser or flame annealing, tempering and/or bending.

The liquid composition preferably comprises less than 20% by weight of solvent with respect to the total weight of the liquid composition and a viscosity between 0.05 and 5 Pa·s.

The process for protecting a substrate additionally comprises a step of removing said temporary protective layer via a heat treatment. The heat treatments are selected from annealing, for example by flash annealing such as laser or flame annealing, tempering and/or bending. The heat treatment temperature is above 200° C., above 300° C. or above 400° C.

The heat treatment needed for removing the protective layer may be annealing in a static or dynamic furnace. The heat treatment may then have the objective of improving the crystallization of one or more layers included in the multilayer to be protected.

The functional coating comprises at least one functional layer deposited during a magnetron deposition step.

The temporary protective layer is formed immediately after the step of depositing the functional coating. According to the invention, it is considered that the temporary protective layer may be formed "immediately after", when the temporary protective layer may be formed less than 10 minutes, preferably less than 5 minutes and better still less than 1 minute after the step of depositing the functional coating.

The invention also relates to a production line for an article comprising a substrate comprising two main faces defining two main surfaces separated by edges, said substrate bearing:
a functional coating deposited on at least one portion of one main surface and
a temporary protective layer deposited on at least one portion of the functional coating obtained from a liquid composition,
characterized in that it comprises:
i) a device for depositing a functional coating,
ii) a device for depositing a liquid composition comprising a storage means and a means that enables said liquid composition to be applied in the form of a layer,
iii) a device for crosslinking, for example thermal crosslinking, UV irradiation crosslinking or electron beam crosslinking,
iv) means for enabling said substrate to be moved from devices i) to iii).

The device for depositing a functional coating may be a pyrolysis deposition device, a chemical deposition device and preferably a magnetron sputtering device.

The device for depositing a liquid composition comprising a storage means and a means for enabling said liquid composition to be applied in the form of a layer is preferably a roll-coating device. This device may comprise an application roll and a backing roll. The liquid composition may then be transported by pumping into the space defined between the two rolls constituting a storage means and applied by driving of the rolls.

Preferably, the crosslinking device is a UV lamp.

The glass substrate protected according to the invention may be stacked without cross-pollution nor appearance of mechanical scratches, immediately after deposition of the functional coatings.

The glass substrate protected according to the invention advantageously meets the following criteria:
mechanical scratch protection that translates, for example, into a resistance to the Erichsen scratch test (EST) of at least 7 N and to the Clement test of greater than 20 N,
protection against the mechanical stresses of the processing that translates into an increased resistance of the functional coating located under the protective layer to the various storage methods, to the washing machine brush and to shaping and cutting,
protection against wet corrosion, in particular corrosion mechanism of silver layers subjected to the condensation of a water film during the storage or transport,
resistance of the protective layer during tempering for a sufficient time so that the glass remains highly emissive over a period of time that enables a significant energy saving,
excellent adhesion of the protective layer to the functional coating in order to withstand all the processing steps before tempering without delamination,
removal of the temporary protective layer without leaving mineralized residues in the case of tempering or bending irrespective of the type of heating (radiative/convective).

EXAMPLES

I. Materials Used

1. Substrates and Functional Layers

The substrates used are flat glass substrates having a thickness of around 6 mm obtained by a float process that consists in pouring the molten glass onto a tin bath.

Functional coatings that confer solar-control properties and that comprise a thin-film multilayer were deposited using a magnetron sputtering device.

The first functional coating, referred to hereinbelow as Ag trilayer, successively comprises, starting from the substrate, an alternation of three silver layers (functional metallic layers) and of four antireflection coatings, each antireflection coating comprising at least one dielectric layer, so that each functional metallic layer is positioned between two antireflection coatings. The total thickness of this functional coating is between 200 and 250 nm.

The second functional coating, referred to hereinbelow as Ag bilayer, comprises a thin-film multilayer that successively comprises, starting from the substrate, an alternation of two silver layers and of three antireflection coatings, each antireflection coating comprising several dielectric layers, so that each silver layer is positioned between two antireflection coatings. The total thickness of this functional coating is between 150 and 200 nm.

The upper layer of the first and second functional coatings is selected from:
- OC1: a layer of titanium zirconium hafnium nitride obtained from targets of titanium metal, metal alloy of titanium and zirconium or metal alloy of titanium, zirconium and hafnium (TiZrHfNx) of 2 to 5 nm,
- OC2: a layer of titanium oxide obtained from a target of titanium metal or a sub-stoichiometric titanium oxide TiOx (x<2) of 2 to 5 nm or
- OC3: a layer of silicon nitride obtained from an optionally doped silicon target of 10 to 50 nm.

2. Temporary Protective Layer

Liquid compositions were produced with mixtures of oligomers and monomers comprising at least one acrylate function sold by the company Sartomer:

CN9276: tetrafunctional aliphatic urethane-acrylate oligomer,

SR351: trimethylolpropane triacrylate, trifunctional acrylate monomer,

SR833S: tricyclodecane dimethanol diacrylate, difunctional acrylate monomer.

The presence of the urethane-acrylate oligomer makes it possible to adjust the hardness and flexibility properties of the temporary protective layer.

The temporary protective layer is then cured either by drying or by UV crosslinking. A polymerization initiator is added and chosen as a function of the type of crosslinking. For example:
- for thermal crosslinking, the initiator is benzoyl peroxide,
- for UV crosslinking, the initiator may be selected from the photoinitiators sold by BASF under the name Irgacure® such as Irgacure 500, by Lambson under the name Speedcure 500 or by Lamberti under the name Esacure HB.

| Compositions | A | B | C | D |
|---|---|---|---|---|
| Main constituents: | | | | |
| acrylate oligomer | 40 | 40 | 60 | 36 |
| difunctional acrylate | 30 | 30 | 20 | 25 |
| trifunctional acrylate | 30 | 30 | 20 | 25 |
| Initiator: | | | | |
| Thermal | 3 | — | — | — |
| UV | — | 5 | 5 | 5 |
| Solvent: butyl acetate | — | — | — | 9 |
| Viscosity at 25° C. (Pa · s) | 0.71 | 0.50 | 1.08 | 0.15 |

The compositions are defined in parts by weight.

The main constituents consist of oligomers, monomers and optionally prepolymers.

The liquid compositions are applied to the glass substrates by roll coating. Thicknesses between 10 and 20 µm are obtained using speeds for the applicator roll of between around 15 and 25 m/min.

The temporary layers A cured by drying are heated at 150° C. for 15 min and are thus perfectly dry and hard.

The temporary layers D are pre-dried in an IR oven at a temperature of at least 120° C. but less than 170° C. before passing under UV for crosslinking.

The temporary layers B, C or D cured by UV irradiation are crosslinked at a rate of 15 m/min by UV radiation provided by a mercury lamp having a power of 120 W. Under these conditions, the polymerization of the mixture of monomers and oligomers is obtained in the thickness range from 10 to 20 µm.

The temporary layers cured by UV irradiation may also be crosslinked using an LED UV crosslinking system.

II. Evaluation of the Mechanical Properties

These tests were carried out on glass substrates bearing:
- a silver trilayer functional coating,
- a temporary protective layer of type C.

The thicknesses tested for the functional layer are respectively 13 and 20 µm.

The substrates are subjected to thermal tempering under the following conditions: 685-695° C. for 40-50 s/mm of glass. Next, an Erichsen scratch test (EST) and a high humidity (HH) test are carried out.

The Erichsen test consists in reporting the value of the force needed, in newtons, to produce a scratch in the multilayer (van Laar tip, steel ball).

The following assessment indicators were used:
"+++": no scratches,
"0": non-continuous scratches,
"−": many non-continuous scratches,
"−−−": continuous scratches.

The humidity (HH) test consists in storing samples for 8 days at 90% relative humidity and at 60° C. and in observing the possible presence of defects such as corrosion pitting. The following assessment indicators were used:
"+": no pitting,
"−": much pitting.

The tables below summarize the glazing units, the evaluation conditions and the assessment indicators. A reference substrate bearing a functional coating without a temporary protective layer is compared to two substrates bearing a functional coating and a temporary protective layer having a thickness of 13 µm and 24 µm. The test was carried out on two different locations of the surface of one and the same substrate. These examples clearly show the excellent scratch resistance and wet corrosion resistance of the substrates protected according to the invention.

| Erichsen test | 0.1 | 0.5 | 0.7 | 1 | 3 | 5 | 7 | 10 |
|---|---|---|---|---|---|---|---|---|
| Reference | +++ | +++ | +++ | 0 | --- | --- | --- | --- |
|  | +++ | +++ | +++ | 0 | --- | --- | --- | --- |
| C-13 μm | +++ | +++ | +++ | +++ | +++ | +++ | +++ | -- |
|  | +++ | +++ | +++ | +++ | +++ | +++ | +++ | -- |
| C-24 μm | +++ | +++ | +++ | +++ | +++ | +++ | 0 | -- |
|  | +++ | +++ | +++ | +++ | +++ | +++ | +++ | -- |

| HH test | Assessment |
|---|---|
| Reference | - |
| C-13 μm | + |
| C-24 μm | + |

The reference substrate according to the Erichsen test comprises, from 1 N, fine scratches and, at 10 N, numerous highly visible continuous scratches, uniform in thickness. A same substrate protected by a temporary protective layer according to the invention comprises far fewer scratches after tempering for applied forces of 7 to 10 N. Furthermore, the scratches are non-continuous.

The substrates protected by a temporary protective layer according to the invention do not comprise corrosion pitting. These tests show that a substrate bearing a 13 μm thick functional coating is effectively protected.

III. Evaluation of the Properties after Tempering

The tempering tests carried out show the total removal of the temporary protective layer without deterioration of the substrates bearing the functional coatings. This aspect was verified by measuring the colorimetric coordinates. Glass substrates bearing functional coatings which differ by the choice of the upper layer were tested. They comprise, respectively as upper layer, OC1 (TiZrHfNx) and OC2 (TiOx).

Substrates referred to hereinbelow as OC1-Inv and OC2-Inv were protected by a temporary coating of C type and subjected to tempering. For comparison, reference substrates referred to hereinbelow as OC1-Ref and OC2-Ref were not protected and were subjected to tempering.

The colorimetric color change upon heat treatment on the functional coating side, in reflection, induced by the tempering was calculated (ΔE). For this:

the colors in reflection L*, a* and b* in the LAB system measured according to the illuminant D65, on the layer side, are measured and the change is measured in the following manner:

$$\Delta E = (\Delta a^{*2} + \Delta b^{*2} + \Delta L^{*2})^{1/2}.$$

Several measurements of ΔE were made for each glass substrate covered with a functional coating. The table below summarizes the result of these tests.

For the reference substrates, ΔE represents the change between the L, a* and b* values obtained for an unprotected substrate before tempering and for a tempered unprotected substrate.

For the substrates of the invention, ΔE corresponds to the change between the L, a* and b* values obtained for an unprotected substrate before tempering and for a protected substrate, the protective layer of which has been removed following tempering.

| Substrate | OC1-Inv | OC1-Ref | OC2-Inv | OC2-Ref |
|---|---|---|---|---|
| ΔE | 11.21 | 10.70 | 12.71 | 10.43 |
|  | 11.15 | 11.13 | 12.51 | — |
|  | 11.95 | 10.81 | 12.93 | — |

These tests show that the presence of the temporary protective layer according to the invention does not modify the colorimetric changes that may be induced by a tempering type treatment. Indeed, the difference between the values of ΔE are not significant between a substrate according to the invention and a reference substrate that are tempered with respect to an untempered substrate.

Regardless of the nature of the upper layer, no colorimetric change is observed that can be attributed to the presence of the temporary protective layer. This means that the temporary protective layer does not induce a colorimetric modification in the substrate after heat treatment.

IV. Influence of the Upper Layer

Comparative tests for evaluating the influence of the upper layer on the appearance after tempering were carried out. Substrates bearing functional coatings of silver trilayer type with different upper layers were tested. Each of these substrates was covered with a temporary protective layer of C type then subjected to a heat treatment of tempering type.

The observations of the surface after heat treatment, as a function of the nature of the upper layer, are the following:
OC1 (TiZrHfNx): no defect,
OC2 (TiOx): no defect,
OC3 (Si₃N₄): no defect.

Other upper layers were tested. These layers did not make it possible to obtain results as good as those obtained with the nitrides, oxides or oxynitrides of titanium, zirconium and/or hafnium. Functional coatings comprising upper layers based on titanium, zirconium and/or hafnium protected by temporary layers according to the invention show a better corrosion resistance and very low levels of haze.

The invention claimed is:

1. An article comprising a substrate comprising two main faces defining two main surfaces separated by edges, said substrate bearing:
    a functional coating deposited by magnetron sputtering deposited on at least one portion of one main surface, said functional coating including an upper layer having a thickness from 1 nm to 40 nm, and
    a temporary protective layer deposited on at least one portion of the functional coating, wherein,
    the temporary protective layer is deposited directly in contact with the upper layer of the functional coating,
    the temporary protective layer has a thickness of at least 1 micrometer,
    the temporary protective layer is not soluble in water, and
    the temporary protective layer is obtained from a composition comprising (meth)acrylate compounds,
    the substrate bearing the functional coating has not undergone a heat treatment at a temperature above 400° C.

2. The article comprising a substrate as claimed in claim 1, wherein the (meth)acrylate compounds that have reacted together represent at least 90% by weight of a weight of the temporary protective layer.

3. The article comprising a substrate as claimed in claim 1, wherein the functional coating comprises a thin-film multilayer successively comprising, starting from the substrate, an alternation of n functional metallic layers based on silver or on a metal alloy containing silver, and of (n+1) antireflection coatings, each antireflection coating comprising at least one dielectric layer, so that each functional metallic layer is positioned between two antireflection coatings.

4. The article comprising a substrate as claimed in claim 1, wherein the upper layer is selected from nitrides, oxides or oxynitrides of titanium, of zirconium and/or of hafnium.

5. The article comprising a substrate as claimed in claim 4, wherein the upper layer is selected from a layer:
of titanium nitride; of zirconium nitride; of hafnium nitride; of titanium zirconium nitride; of titanium zirconium hafnium nitride,
of titanium oxide; of zirconium oxide; of hafnium oxide; of titanium zirconium oxide; of titanium zirconium hafnium oxide.

6. The article comprising a substrate as claimed in claim 1, wherein the temporary protective layer is completely removable during a heat treatment by decomposition without damaging the optical, energy or thermal properties conferred on the substrate by the functional coating.

7. The article comprising a substrate as claimed in claim 1, wherein a thickness of the functional coating is greater than 100 nm and less than 300 nm.

8. The article comprising a substrate as claimed in claim 7, wherein the thickness of the functional coating is greater than 150 nm and less than 250 nm.

9. The article comprising a substrate as claimed in claim 1, wherein the thickness of the temporary protective layer is between 2 and 100 micrometers.

10. The article comprising a substrate as claimed in claim 9, wherein the thickness of the temporary protective layer is between 5 and 50 micrometers.

11. The article comprising a substrate as claimed in claim 10, wherein the thickness of the temporary protective layer is between 10 and 30 micrometers.

12. The article comprising a substrate as claimed in claim 1, wherein the temporary protective layer has a grammage between 5 and 50 g/m$^2$.

13. The article comprising a substrate as claimed in claim 1, wherein the temporary protective layer has a grammage between 10 and 30 g/m$^2$.

14. The article comprising a substrate as claimed in claim 1, wherein the substrate bearing the temporary protective layer has not undergone a heat treatment of tempering, annealing and/or bending.

15. The article comprising a substrate as claimed in claim 1, wherein the substrate is a glass substrate.

16. The article comprising a substrate as claimed in claim 15, wherein the glass substrate has a thickness between 1 mm and 19 mm.

17. The article comprising a substrate as claimed in claim 16, wherein the thickness of the glass substrate is between 3 mm and 6 mm.

18. The article as claimed in claim 1, wherein the thickness of the upper layer is from 1 nm to 20 nm.

19. The article as claimed in claim 18, wherein the thickness of the upper layer is from 1 nm to 5 nm.

20. The article as claimed in claim 1, wherein the upper layer is a silicon nitride layer, optionally doped with aluminum.

* * * * *